(12) United States Patent
Pollard, II

(10) Patent No.: US 6,260,613 B1
(45) Date of Patent: *Jul. 17, 2001

(54) TRANSIENT COOLING AUGMENTATION FOR ELECTRONIC COMPONENTS

(75) Inventor: Lloyd Pollard, II, Portland, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/225,420

(22) Filed: Jan. 5, 1999

(51) Int. Cl.$^7$ .................................................. F28F 7/00
(52) U.S. Cl. ............... 165/185; 165/104.33; 165/104.21; 257/715; 361/700
(58) Field of Search .................. 165/104.21, 104.26, 165/104.33, 901, 902; 361/700; 257/715

(56) References Cited

U.S. PATENT DOCUMENTS

| | | | |
|---|---|---|---|
| 2,499,736 | * | 3/1950 | Kleen ........................ 165/104.21 X |
| 3,687,612 | * | 8/1972 | Ernst ......................... 165/104.21 X |
| 4,009,418 | * | 2/1977 | Bennett ..................... 165/104.21 X |
| 4,119,085 | * | 10/1978 | Knowles et al. ........... 165/104.21 X |
| 4,273,100 | * | 6/1981 | Cogliano ................... 165/104.21 X |
| 4,285,027 | * | 8/1981 | Mori et al. ................. 165/104.21 X |
| 4,306,613 | * | 12/1981 | Christopher ............... 165/104.33 X |
| 4,355,522 | * | 10/1982 | Gorski et al. ............. 165/104.21 X |
| 4,382,466 | * | 5/1983 | Shiraishi .................... 165/184.21 X |
| 4,509,334 | * | 4/1985 | Nakagome et al. ....... 165/104.21 X |
| 5,411,077 | * | 5/1995 | Tousignant ................ 165/104.33 |
| 5,579,830 | * | 12/1996 | Giammaruti .............. 165/104.21 X |
| 5,647,429 | * | 7/1997 | Oktay et al. .............. 165/104.33 X |
| 5,699,227 | * | 12/1997 | Kolman et al. ........... 165/104.33 X |
| 5,704,416 | * | 1/1998 | Larson et al. ............. 165/104.21 X |

FOREIGN PATENT DOCUMENTS

| | | | |
|---|---|---|---|
| 362295442 | * | 12/1987 | (JP) ...................................... 257/715 |
| 40415495 | * | 5/1992 | (JP) ................................. 165/104.33 |

\* cited by examiner

*Primary Examiner*—Christopher Atkinson
(74) *Attorney, Agent, or Firm*—Blakely, Sokoloff, Taylor & Zafman LLP

(57) ABSTRACT

An electronic assembly that may include a two-phase material that absorbs heat generated by an integrated circuit. The heat may be transferred from the integrated circuit to the two-phase material by a heat pipe. The two-phase material can absorb heat in an isothermal process utilizing the latent heat of the material. The isothermal process allows the two-phase material to absorb heat generated by the integrated circuit without raising the temperature of the assembly.

12 Claims, 1 Drawing Sheet

TRANSIENT COOLING AUGMENTATION FOR ELECTRONIC COMPONENTS

BACKGROUND OF THE INVENTION

1. Field of the Invention

The present invention relates to an electronic assembly that contains a two-phase material to absorb heat generated within the assembly.

2. Background Information

Integrated circuits are typically assembled into packages that are mounted to a printed circuit board. The integrated circuits generate heat which must be removed from the packages to insure that the junction temperatures do not exceed a specified level. Some electronic assemblies incorporate heat slugs and heat sinks to facilitate the transfer of heat away from the package. The heat may be transferred from the heat sink by a flow of air that is generated by a fan.

For high powered integrated circuits such as microprocessors there have been developed electronic assemblies that incorporate heat pipes to transfer heat away from the packages. A heat pipe contains a fluid that is enclosed by an outer metal tube. Heat is transferred into the tube and evaporates the fluid at an evaporator end of the heat pipe. The evaporated fluid then flows to a condenser end of the pipe where the heat is removed and the fluid returns to a liquid phase. The liquid flows back to the evaporator end through a wick that is attached to the inner surface of the outer tube.

Integrated circuits may undergo a "power burst" wherein the circuit generates an above average amount of heat. The power burst may increase the temperature of the heat sink, the package and the integrated circuit.

There have been developed systems that sense the initiation of a power burst and increase the fan speed to improve the heat transfer rate from the heat sink and package. Unfortunately, there is a time delay between the initiation of the power burst and the effective removal of additional heat from the package. Additionally, the higher fan speed may increase the noise of the system. It would be desirable to provide an electronic assembly that can dissipate a power burst from an integrated circuit without significantly increasing the temperature of the circuit.

SUMMARY OF THE INVENTION

One embodiment of the present invention is an electronic assembly that may include a two-phase material that absorbs heat generated by an integrated circuit. The heat may be transferred from the integrated circuit to the two-phase material by a heat pipe.

DETAILED DESCRIPTION

Figure 1:
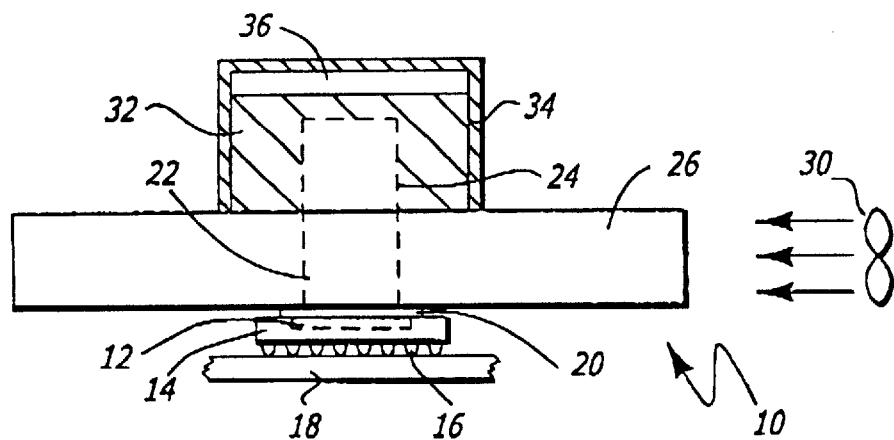
FIG. 1 is a schematic of an embodiment of an electronic assembly of the present invention.

Referring to the drawings more particularly by reference numbers, FIG. 1 shows an embodiment of an electronic assembly 10 of the present invention. The assembly 10 may include an integrated circuit 12 that is located within an integrated circuit package 14. The integrated circuit package 14 may have a plurality of contacts 16 that are connected to a printed circuit board 18. The contacts 16 may be solder balls, pins or any other means of connecting the package 14 to the circuit board 18. Although a package 14 is shown and described, it is to be understood that the integrated circuit 12 may be mounted directly to the circuit board 18 without a package 14.

The package 14 may include a lid 20 that is constructed from a thermally conductive material such as copper or aluminum and provides a thermal path for heat to transfer from the integrated circuit 12. An evaporator end 22 of a heat pipe 24 may be thermally coupled to the lid 20 of the package 14. Although a lid 20 is shown and described, it is to be understood that the evaporator end 22 of the heat pipe 24 can be coupled directly to the integrated circuit 12.

The heat pipe 24 and package 14 may be attached to a heat sink 26. The heat sink 26 may be constructed from a thermally conductive material such as aluminum or copper. Heat generated by the integrated circuit 12 can be transferred into the heat sink 26 through the heat pipe 24. Heat may also flow from the package 14 into the heat sink 26. The assembly 10 may include a thermal epoxy or grease 28 that provides a thermal interface between the heat sink 26 and the package 14. There may be a fan 30 that generates a flow of air which removes the heat from the heat sink 26.

The heat pipe 24 may extend into a two-phase material 32. The two-phase material 32 may absorb heat transferred by the heat pipe 24. The absorption of heat may cause the two-phase material 32 to change phase. The latent heat of vaporization or latent heat of liquification of the two-phase material 32 may allow the material to absorb the heat at a constant temperature in an isothermal or nearly isothermal process. The two-phase material 32 can thus provide a heat sink that absorbs heat without significantly increasing the temperature of the assembly 10.

By way of example the two-phase material 32 may be a paraffin that is enclosed by a housing 34. In one embodiment the paraffin may change from a solid state to a liquid state between 60–80 degrees centigrade. The paraffin may include metal fillers or other material to increase the thermal conductivity of the two-phase material 32. The housing 34 may be elastic to compensate for the change in volume when the two-phase material changes phase. Alternatively, the housing 34 may contain a volume of gas 36 that is compressed when the two-phase material 32 changes to the liquid state.

Figure 2:
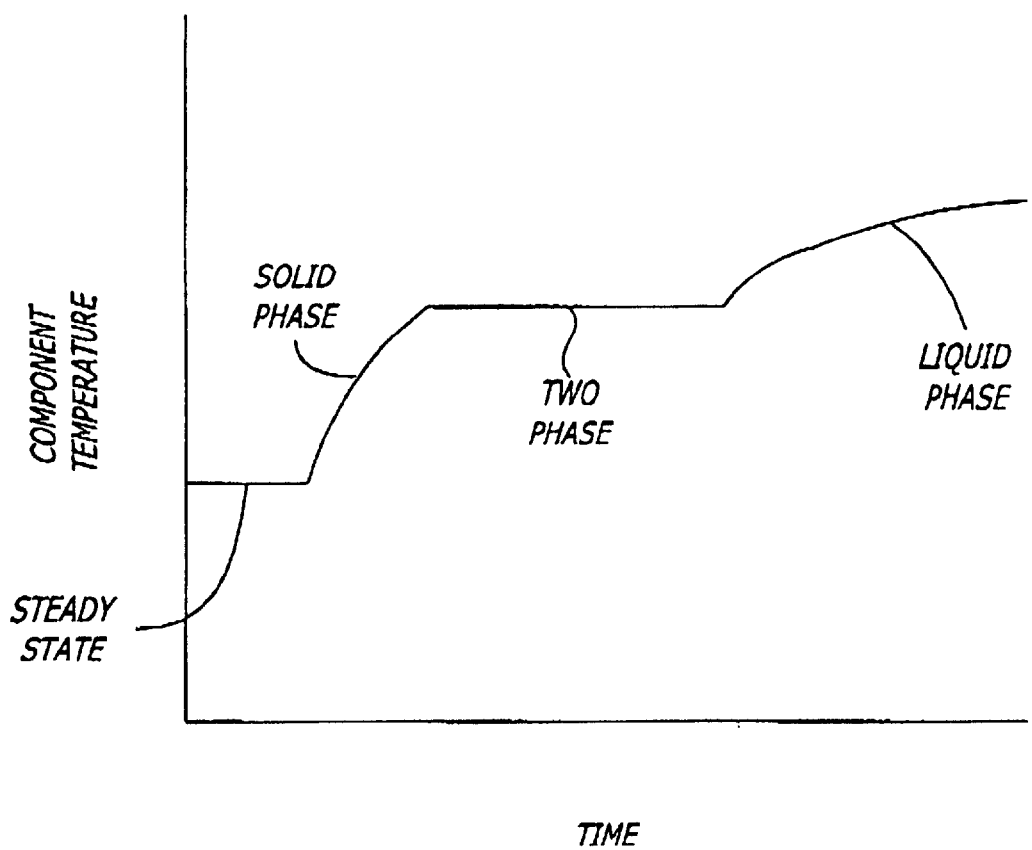
FIG. 2 is a graph showing the absorption of heat by a two-phase material of the assembly.

FIG. 2 shows a graphical representation of the effect of the two-phase material absorbing heat in an isothermal process. The integrated circuit 12 may initially generate heat in a relatively steady state condition. The heat is transferred to the heat sink 26 through the heat pipe 24 and the package 14. Some of the heat may also be transferred into the two-phase material. The integrated circuit 12 may have a steady state temperature as indicated on the graph.

The integrated circuit 12 may undergo a power burst wherein the circuit 12 generates heat at a much higher rate than the heat generated under steady state conditions. The additional heat is transferred into the two-phase material 32. The temperature of the two-phase material and the resultant integrated circuit temperature will increase while the material 32 is still in the initial solid phase as indicated by the graph.

At some point during the power burst the two-phase material will change phase while continuing to absorb heat generated by the integrated circuit 12. As shown in FIG. 2 the temperature of the two-phase material 32 and the integrated circuit 12 remain relatively constant while the material is changing phase. At some point the entire two-phase material 32 changes to the liquid phase at which point the temperature of the material 32 and the integrated circuit 12 will again raise during the power burst. It is desirable to provide enough two-phase material 32 to insure that the entire material never completely changes phase.

When the power burst terminates the heat within the two-phase material can flow into the heat sink 26 and be removed by the airflow of the fan 30. The removal of heat will cause the two-phase material 32 to return to the original solid state. The two-phase material 32 provides a material that can absorb additional heat without appreciably increasing the temperature of the assembly.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

By way of example, although an assembly with a heat pipe is shown and described, it is to be understood that the two-phase material can provide an isothermal heat sink for any electronic assembly.

What is claimed is:

1. An electronic assembly comprising:

a housing;

an integrated circuit package that has a lid;

a heat sink that is coupled to said integrated circuit package;

a two-phase material that is located within the housing, the two-phase material changes from a solid phase to a liquid phase in response to an increase in temperature of the integrated circuit package; and, a heat pipe that is thermally coupled to the integrated circuit package lid, the heat pipe includes a first end thermally coupled to the lid of the integrated circuit package and a second end in contact with the two-phase material so that the heat pipe extends from the integrated circuit package through said heat sink and into the two-phase material.

2. The electronic assembly of claim 1, further comprising a fan that generates a flow of air across the heat sink.

3. The electronic assembly of claim 1, further comprising a volume of gas that is located within said housing.

4. The electronic assembly of claim 1, wherein the increase in temperature is in a range of 60–80 degrees centigrade.

5. The electronic assembly of claim 1, wherein said two-phase material is a paraffin.

6. A method for removing heat from an integrated circuit, comprising:

coupling both a first end of a heat pipe to an integrated circuit package that houses an integrated circuit and a second end of the heat pipe to a two-phase material;

transferring heat from the integrated circuit into a heat sink via the heat pipe; and, transferring heat from the heat sink to the two-phase material that is in series with the integrated circuit and the heat sink, the transfer of heat to the two-phase material changes the two-phase material from a solid phase to a liquid phase.

7. The method of claim 6 further comprising:

generating a flow of air across the heat sink to remove the heat.

8. An electronic assembly comprising:

a housing;

an integrated circuit package that has a lid;

a heat sink that is coupled to the lid of the integrated circuit package;

a two-phase material that is located within the housing, the two-phase material changes from a solid phase to a liquid phase in response to an increase in temperature of the integrated circuit package; and, a heat pipe including a first end that is thermally coupled to the integrated circuit package lid, the heat pipe extends from the integrated circuit package through the heat sink and into the housing having the two-phase material that contacts a second end of the heat pipe.

9. The electronic assembly of claim 8, further comprising a fan that generates a flow of air across said heat sink.

10. The electronic assembly of claim 8, further comprising a volume of gas that is located within said housing.

11. The electronic assembly of claim 21, wherein the increase in temperature is in a range of 60–80degrees centigrade.

12. The electronic assembly of claim 8, wherein said two-phase material is a paraffin.

* * * * *